United States Patent [19]
Huebner

[11] Patent Number: 5,419,806
[45] Date of Patent: May 30, 1995

[54] METHOD FOR MANUFACTURING A THREE-DIMENSIONAL CIRCUIT APPARATUS

[75] Inventor: Holger Huebner, Baldhaur, Germany

[73] Assignee: Siemens Aktiengesellschaft, Munich, Germany

[21] Appl. No.: 186,323

[22] Filed: Jan. 25, 1994

[30] Foreign Application Priority Data

Feb. 11, 1993 [DE] Germany ............ 43 04 119.1

[51] Int. Cl.⁶ .................. B44C 1/22; C03C 15/00; C23F 1/00; H01L 21/306
[52] U.S. Cl. .................. 156/645.1; 437/78; 437/86; 437/203
[58] Field of Search ............ 156/643, 645, 647, 651, 156/657, 662, 668, 630, 631, 656; 437/51, 56, 78, 86, 203; 257/772

[56] References Cited

U.S. PATENT DOCUMENTS

| | | | |
|---|---|---|---|
| 4,893,174 | 1/1990 | Yamada et al. | 357/82 |
| 4,897,708 | 1/1990 | Clements | 357/65 |
| 5,087,585 | 2/1992 | Hayashi | 437/51 |
| 5,170,930 | 12/1992 | Dolbear et al. | 228/123 |
| 5,336,929 | 8/1994 | Hayashi | 257/772 |

FOREIGN PATENT DOCUMENTS

| | | |
|---|---|---|
| 0238089 | 9/1987 | European Pat. Off. |
| 0110307 | 8/1989 | European Pat. Off. |
| 82790 | 6/1971 | Germany |
| 2902002 | 7/1980 | Germany |
| WO91/11833 | 8/1991 | WIPO |
| WO92/06491 | 4/1992 | WIPO |

OTHER PUBLICATIONS

Three-dimensional ICs Project (Fiscal 1981–1990), Research and Development Association for Future Electronic Dev., FED, Tokyo, 1991, Chapter 2.1.

C. A. MacKay, Proc of the Techn. Conf., 9th Annual Int. Electronics Packaging Conf., IEPS, San Diego, Calif., USA, 1989, pp. 1244–1259.

*Primary Examiner*—William Powell
*Attorney, Agent, or Firm*—Hill, Steadman & Simpson

[57] ABSTRACT

A method for producing a three-dimensional circuit apparatus, wherein substrates that are arranged above one another are firmly joined to one another by depressions in the adjoining surfaces of the neighboring substrates. The depressions are filled with a mixture of two metal constituents, one being a liquid and the other being a solid and the solid constituent dissolves in the liquid constituent, which leads to the hardening of the mixture, and firmly joins the depressions to one another due to the hardening of the mixture. In addition, detached components are arranged on prepared substrate wafers and are firmly joined thereto.

26 Claims, 4 Drawing Sheets

METHOD FOR MANUFACTURING A THREE-DIMENSIONAL CIRCUIT APPARATUS

BACKGROUND OF THE INVENTION

1. Field of the Invention

The present invention generally relates to semiconductor circuits, and specifically to a method for manufacturing a three-dimensional circuit apparatus.

2. Description of the Prior Art

Semiconductor circuits are being increasingly designed wherein integrated circuits of various technologies are combined. Thus, for example, CMOS memories are combined with bipolar processors and sensor modules are combined with logic modules. The integrated circuits are thereby usually arranged side-by-side on printed circuit boards. The integrated circuits contact one another via metal tracks.

These different integrated circuits are to be combined in a chip housing to achieve an increase in the packing density and a shortening of the connecting paths. The substrates that contain integrated circuits and that can be composed of different substrate materials and/or can be fabricated in different technologies are thereby respectively ground down to a few 10 $\mu$m and are arranged as stacks. Contacts passing through the substrates must be fashioned in vertical direction. Viewed from the outside, such a component stack looks like a new semiconductor module. A standard housing having a reduced number of terminals can be used, even though the component stack has an enhanced functionality.

Three-Dimensional ICs Project (Fiscal 1981–1990) Research and Development Association for Future Electron. Dev., FED, Tokyo, 1991, Chapter 2.1, discloses a method in which vertical contacts can be realized between substrates arranged above one another in a stack. In a known method, contacts between an upper substrate and a lower substrate that are arranged immediately above one another and adjacent to one another in the stacks are produced. Tungsten pins having a cross section of approximately 3$\times$3 $\mu m^2$ are formed on the upper side of the lower substrate. These tungsten pins project 1-2 $\mu$m from the upper side of the lower substrate. Large-area depressions that have dimensions of approximately 20$\times$20 $\mu m^2$ are produced at a corresponding location of the underside of the upper substrate, these being filled with an Au/In alloy. When the upper substrate and the lower substrate are stacked on top of one another, the tungsten pins penetrate into these filled depressions. They are soldered at 300°–400° C. A layer of polyimide as a glue is applied to the upper side of the lower substrate and to the underside of the upper substrate to compensate for surface topographies and to produce an additional, mechanical connection between the upper substrate and the lower substrate.

The upper side of the upper substrate has a stabilizing carrier plate glued onto it for producing the depressions at the underside of the upper substrate. Subsequently, the upper substrate is ground at the underside. An additional wiring level is subsequently produced at the underside, which is in communication with a metallization level of the circuit. The additional wiring level is covered with a polyimide layer wherein the depressions that are filled with Au/In are produced. The depressions thereby extend to the additional wiring level. These process steps lead to substantial stresses that can cause the thin substrate to warp or to even break where the carrier plate is not sufficient to meet these demands.

The tungsten pins are deposited on the upper side of the lower substrate at temperatures around 400° C.–500° C. When the pins cool, the lower substrate is placed under high stresses that attack at points in the substrate. Stress cracks can thereby occur with sensitive substrate materials such as, for example, GaAs or InP.

When soldering the upper substrate to the lower substrate, lateral shifts between the depressions and the tungsten pins occur, since the two substrates have different coefficients of expansion. So that tungsten pins and depressions allocated to one another meet one another despite these shifts, the alignment tolerances and, thus, the dimensions of the depressions must be correspondingly enlarged. During cooling after soldering, these shifts lead to great transfer forces that act on the tungsten pins can lead to the contacts being cut off.

In order to reduce the mechanical stress on the substrates to a bearable degree, the tungsten pins cannot be too densely arranged and cannot be too deeply introduced into the substrate material. The tungsten pins therefore contribute little to the elimination of waste heat from the circuits and components in the substrate.

To form complex component stacks more than two substrates are soldered on top of one another. A detachment of the contacts when soldering additional substrates can only be avoided in the known method by using Au/In alloys with a decreasing melting temperature from level to level. The repeated heating of an alloy to just below the melting point, however, leads to a modification of the crystal structure and a degradation of the contacts.

SUMMARY OF THE INVENTION

It is an object of the present invention to provide a method for producing a three-dimensional circuit apparatus in a cost-effective and efficient manner and in which the disadvantages of the known methods are avoided.

The term "substrate" is used herein for both substrate wafers that, in particular, are composed of semiconductor material and have microelectronic circuit structures and/or optoelectronic components and/or sensor components, as well as for discrete components, optoelectronic components, sensor elements or the like.

In the method of the invention, at least one depression is produced both in the upper substrates at the underside thereof as well as in the lower substrates adjacent thereto on the upper side thereof. These depressions extend up to a metallization level in the respective substrate and their side walls have an insulation. The depressions are filled with a mixture of two metal constituents, wherein one is liquid at the processing temperature and the other is solid. The solid constituent dissolves in the liquid constituent, which leads to a hardening of the mixture. Given upward transgression of the solidus curve in the phase diagram, the mixture has completely solidified. The upper substrate is stacked onto the lower substrate so that the depressions in the upper substrate meet allocated depressions in the lower substrate. The firm connection between the neighboring substrates which is electrically conductive and therefore represents a contact between the metallization levels in the neighboring substrates is formed due to the curing of the mixture.

The term "amalgam" is frequently employed in German usage for such a mixture wherein the liquid constituent is composed of mercury. Such a mixture is also referred to as amalgam in C. A. MacKay, Proc. of the Tech. Conf., 9th Annual Int., Electronics Packaging Conf., IEPS, San Diego, Calif., USA, 11–13 Sep. 1989, pages 1244–1259, when the liquid constituent is arbitrary and has the aforementioned properties. The term "amalgam" is used in this sense below. In the invention, the liquid constituent is not limited to mercury. In particular, the liquid constituent in the method of the invention is composed of mercury (Hg), gallium (Ga), Indium (In), alloys of Ga/Sn, Ga/In or Ga/In/Sn or other combinations with mercury, cadmium and/or bismuth. The solid constituent in the method of the invention is particularly selected from antimony, cobalt, copper, chromium, germanlure, gold, iron, nickel, magnesium, manganese, platinum, palladium, silver and vanadium.

Both the processing temperature as well as the melting point of the hardened amalgam can be set by selecting the constituent. Processing temperatures below 100° C. occur when the liquid constituent is formed, for example, of Ga, Hg, In or of an alloy having a correspondingly low melting point such as, for example, In/Sn, Ge/Sn or Ge/In. Hardened amalgam in the systems Ga/Ni, Hg/Al and Ge/Cu has a melting point above 500° C.

C. A. MacKay, also discloses that amalgams may be used for bonding materials having clearly different coefficients of thermal expansion or temperature-sensitive components. However, only macroscopic applications are disclosed, such as: the bonding of a solar cell to a carrier or the application of the heat sink, whereby two plates are joined surface-wide, or the filling of via holes in ceramic substrates by which metal tracks at the front and back side of an interdigital wafer are connected to one another.

The use of amalgams for connecting and through-contacting substrates that, in particular, comprise microelectronic circuits or optoelectronic components, by contrast, represents an operation performed on the individual component. Depressions that are on the order of magnitude of the structures of the component and that extend up to a metallization level of the component must be produced and filled. It can be derived from the above reference that the solid constituent should be a powder having a powder particle size of approximately 45 $\mu$m for lengthening the time for hardening the amalgam so that this time is adequate for processing. Depressions having diameters below 10 $\mu$m, specifically 1–3 $\mu$m, are to be filled by the inventive joining and through-contacting of substrates. However, a powder particle size of 45 $\mu$m is unsuitable for this purpose.

Before dividing the substrate wafer into a plurality of components, it is especially advantageous to make the depressions, the side wall insulations and, potentially, the auxiliary layer for promoting the wetting at the substrate wafer. In this way, the processing steps need only be done once for the entire substrate wafer. It is advantageous for constructing the three-dimensional circuit arrangement to use detached components as the upper substrate, which are arranged at and secured to the corresponding location of a substrate wafer that is the lower substrate. It is thereby possible to arrange only functioning components on the functioning components of the lower substrate wafer. The yield of the method is dramatically increased in this way, since non-functioning components are not used.

After the arrangement and fastening of a first component at the surface of a first substrate wafer, the first substrate wafer is divided in accord with the shape of the components, to produce component stacks. These can in turn be arranged at and secured to a further substrate wafer as detached components.

Substrate wafers that are used as a middle level, i.e. that are employed both as a lower as well as an upper substrate in successive method steps, have depressions at opposite sides. That side at which the circuit structures and components are arranged is thereby processed first. The depressions have side wall insulations, potentially have an auxiliary layer and are filled with an amalgam. After the hardening of the amalgam, a carrier is glued to this side of the substrate wafer. Subsequently, substrate material is eroded from the side facing away from the carrier. This happens, for example, by thin-grinding or spinning etching. The remaining substrate material has a thickness of 10 $\mu$m. Depressions are then produced in the side facing away from the carrier, and these depressions have a side wall insulation and, potentially have an auxiliary layer. Subsequently, the substrate wafer is turned so that the carrier is directed down. The depressions at the side facing away from the carrier are filled with amalgam and the component or components are arranged at the upper side of the substrate wafer that is used as a lower substrate. The component stack is divided after the hardening of the amalgam.

The amalgam is produced, for example, of the constituents liquid gallium and copper powder or liquid gallium and nickel powder. It is thereby advantageous to use copper or nickel powder wherein the individual powder particles have a porous oxide layer on their surface. This porous oxide layer delays the dissolving of the powder in the liquid metal and causes an extended processing time, even with fine powders having particle diameters of 1–2 $\mu$m.

A further possibility for extending the processing time is applying the solid metal constituents to the surface of the depressions as a thin layer. The depressions are subsequently filled with the liquid metal constituent. The blending in of the solution of a solid metal constituent with the liquid metal constituent in this case occurs in the depression.

It is an advantage of the present invention to dope the liquid metal to increase the plasticity of the hardened amalgam. When gallium is used as the liquid metal, boron or tungsten are suitable as dopants.

It is also an advantage of the present invention to fill the depressions with lowviscosity amalgam and to shake excess amalgam off in order to avoid shorts between the amalgam contacts of one level. The shaking, for example, can be a tumbling rotatory motion. The tumbling motion is necessary so that adequate centrifugal forces also take effect in the region of the midpoint of a substrate wafer. Another possibility is applying an alternating magnetic field. To that end, for example, two packets of magnetic windings are arranged above and below the substrate wafer, like a threephase linear motor. As a consequence of the induced eddy current fields, excess metal parts are thereby accelerated toward the edge of the substrate wafer.

It is especially advantageous to employ the amalgams that harden at a temperature corresponding to the operating temperature of the circuit arrangement. Thus, the connections composed of amalgam remain free of forces during operation of the circuit. A further advantage is that the melting point of these amalgams lies above the hardening temperature. Virtually any number of substrates can thus be joined to one another in a plurality of successive process steps without modifying prior connections by softening or recrystallizations.

A further advantage in using liquid amalgam for filling the depressions in the lower substrate is that a fine adjustment of the two substrates relative to one another occurs due to the surface tension when arranging the upper substrate on the lower substrate.

It is advantageous for planarization of the surfaces and for an additional mechanical fixing to apply a polyimide layer to surfaces of neighboring substrates that join one another. These polyimide layers melt and join to one another due to a treatment at a slightly elevated temperature.

Since the temperature budget in the method of the invention avoids mechanical stresses in the circuit arrangement, the cross section of the amalgam connections employed as contact can be selected in conformity with the demands made of the circuit. For example, it is possible to select the cross section of the contacts so large that feed currents can be conducted by a single contact.

Over and above this, it is possible to additionally provide further depressions in the substrates that do not serve the purpose of contacting. These depressions filled with amalgam facilitate the heat elimination from the stack-shaped circuit arrangement in a vertical direction.

It also lies within the framework of the invention for heat elimination to provide polyimide layers between neighboring substrates. Trenches parallel to the surface of the substrates and filled with amalgam are produced in these polyimide layers. These amalgam tracks proceeding in a lateral direction conduct waste heat to the periphery of the stack. The elimination of waste heat from a circuit arrangement is increasingly significant with increased packing density.

The above objects are inventively achieved in a method for manufacturing a three-dimensional circuit apparatus, having the steps of: positioning a first upper substrate having circuit structures, a metallization level and an under side, above a second lower substrate having circuit structures, a metallization level and an upper side, as a stack; producing an upper depression, having side walls with an insulation, in the under side of the upper substrate directly above the upper side of the lower substrate, extending the upper depression into the upper substrate up to the metallization level; producing a lower depression, having side walls with an insulation, in the upper side of the lower substrate such that the lower substrate depression is aligned with the upper substrate depression, extending the lower depression into the lower substrate to the metallization level; and filling the depressions with a mixture of two metal constituents, providing one is a liquid constituent and the other is a solid constituent and the solid constituent dissolves in the liquid constituent, thereby causing a hardening of the mixture, further causing a firm connection between the substrates.

In a further embodiment of the present invention, the objects of the invention are achieved in a method having the steps of: gluing a carrier onto the upper side of a substrate wafer having a plurality of components; thin-grinding a surface of the substrate wafer that faces away from the carrier, wherein the surface has a metallization level; producing a depression having side walls with an insulation extending up to the metallization level in the surface; arranging the substrate wafer such that the carrier is directed down; filling the depression in the substrate wafer with a mixture of two metal constituents, wherein one is liquid and the other is solid and the solid constituent dissolves in the liquid constituent, thereby causing a hardening of the mixture; and arranging a detached component, having a metallization level, as upper substrate on the upper side of the substrate wafer that is used as a lower substrate, producing a depression having side walls with an insulation extending up to the metallization level in the detached component; filling the depression in the detached component with hardened mixture so that the depression in the detached component contacts the depression in the upper side of the substrate wafer; hardening the mixture causing a firm connection between the component and the substrate wafer; and removing the carrier after dividing the substrate wafer for detaching a component stack so that the component stack has a detached component and an allocated component from the substrate wafer.

BRIEF DESCRIPTION OF DRAWINGS

The invention shall be set forth in greater detail below with reference to exemplary embodiments and to the figures.

DETAILED DESCRIPTION OF THE PRESENTLY PREFERRED EMBODIMENTS

Figure 1:
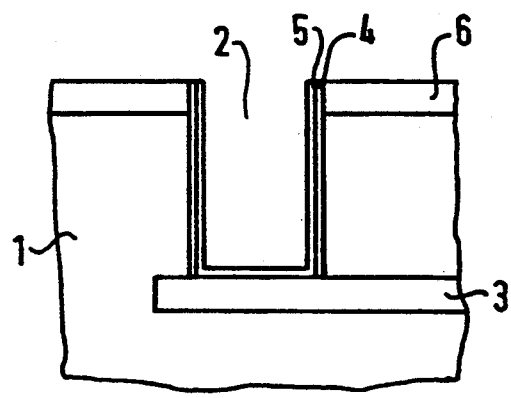
FIG. 1 shows a portion for a cross section through a substrate of the present invention, in which a depression extending up to a metallization level was produced, the side walls thereof being provided with an insulation and with an auxiliary layer.

A polyimide layer 6 is applied surface-wide onto the surface of a substrate 1 (See FIG. 1 ). For example, the substrate 1 is a semiconductor wafer of single-crystal silicon or of a III–V semiconductor. The substrate 1 comprises circuit structures that are a component part of a microelectronic circuit or of an optoelectronic or sensor component. The circuit structures, which are not shown in detail, comprise at least one metallization level 3.

A photoresist mask (not shown) is applied onto the polyimide layer 6. The photoresist mask is used as an etching mask in an anisotropic etching, for example on the basis of plasma etching, for producing a depression 2. The depression 2 extends down to the metallization level 3. The surface of the metallization level 3 is completely uncovered within the depression 2.

An insulating layer that is etched back in an anisotropic etching step is deposited surface-wide. An insulation 4 (see FIG. 1) that completely covers the side wall of the depression 2 is thereby produced. The insulation 4, for example, is composed of $SiO_2$. In the anisotropic re-etching, the insulating layer at the surface of the metallization level 3 is removed within the depression 2, so that a contact to the metallization level 3 can be produced via the depression 2.

Subsequently, an auxiliary layer 5 is produced on the insulation 4 and on the floor of the depression 2. The auxiliary layer 5 is composed of an electrically conductive material that facilitates the wetting of the surface of the depression 2 with amalgam. The auxiliary layer 5 cannot be present outside the depression 2, since it would lead to an electrical short between neighboring depressions. Also, the auxiliary layer 5 is produced, for example, by deposition of a layer and by subsequent anisotropic re-etching. The auxiliary layer 5 is formed, for example, of titanium. By using an amalgam having a liquid metal constituent that wets the surface of the insulation 4 well, as is the case, for example, for liquid gallium and $SiO_2$ as insulation 4, the auxiliary layer 5 can be foregone.

Figure 2:
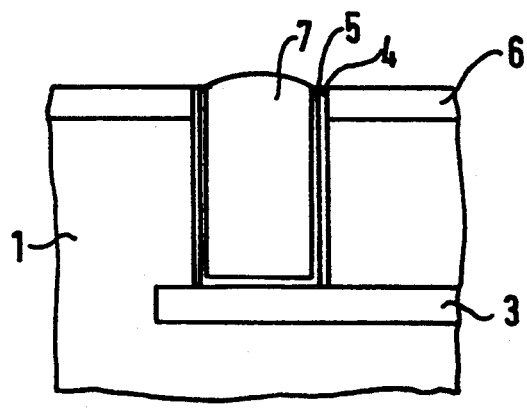
FIG. 2 shows the substrate of the present invention after the depression is filled with amalgam.

The depression 2 is filled with an amalgam 7 (see FIG. 2). When the amalgam 7 hardens, it swells so that it projects slightly beyond the surface of the polyimide layer 6.

According to a first exemplary embodiment, the amalgam 7 is formed of liquid Ga and 30 weight percent Cu powder having powder particle sizes from 1-2 $\mu$m and is hardened at a temperature of 120° C. According to a second exemplary embodiment, the amalgam 7 is formed of liquid Ga and 30-45 weight percent Ni powder having powder particle sizes of 1-2 $\mu$m and is also hardened at a temperature of 120° C.

According to a further exemplary embodiment, the liquid metal constituent and the solid metal constituent of the amalgam 7 are not mixed with one another until they are in the depression 2. To that end, a thin layer of the solid metal constituent is applied onto the surface of the depression 2, i.e. onto the auxiliary layer 5 or, respectively, onto the insulation 4. For example, antimony (Sb), chromium (Cr) or silicon (Si) is used as a solid metal constituent. Subsequently, the depression 2 is filled with liquid gallium. The deposition of the layer of the solid constituent occurs, for example, by CVD or wet-chemical. The solid constituent now dissolves in the liquid constituent in the depression 2, whereby a blending of the solid constituent with the liquid constituent and, finally, a hardening of the amalgam occur. This embodiment has the advantage that the hardening of the amalgam 7 occurs in the depression 2, so that the processing of the liquid metal constituent can last as long as desired.

The filling of the depression 2 can be enhanced by pressure. To that end, the liquid amalgam or the liquid constituent is applied surface-wide under a vacuum. The amalgam or the liquid constituent is subsequently pressed into the depression 2 under atmospheric pressure or over-pressure with air or a protective atmosphere.

The circuit structures in a substrate are usually arranged primarily in region of one surface. When depressions are to be produced in that surface of the substrate facing away from the circuit structures, then it lies within the framework of the present invention to first glue the surface where the circuit structures are primarily arranged, onto a carrier. For example, an untreated Si wafer is suitable as a carrier and, for example, polyimide is used as a glue. Subsequently, that side of the substrate wafer facing away from the carrier is thinly-ground. The preferred thingrinding method is mechanical back-plane grinding. Depressions are then produced in the surface facing away from the carrier, as was set forth with reference to FIG. 1.

Figure 3:
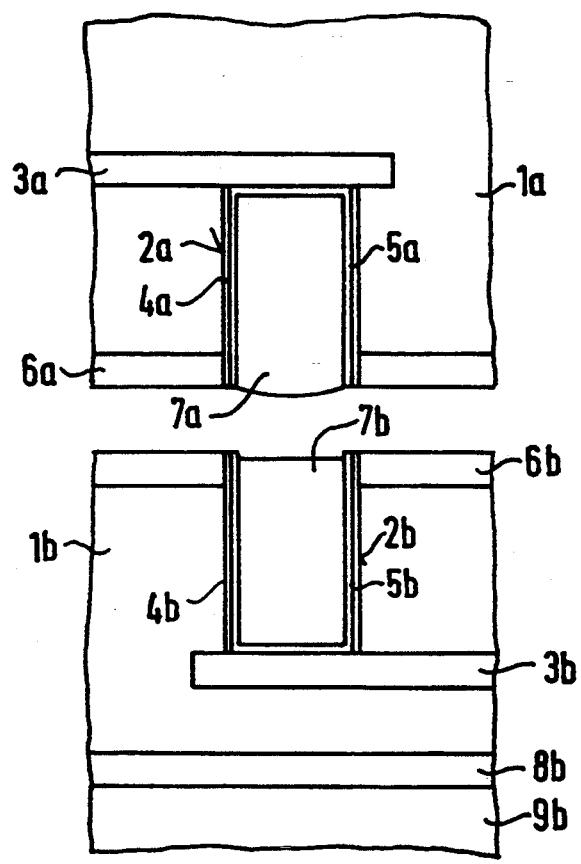
FIG. 3 shows the joining of a lower substrate and of an upper substrate in the present invention.

For producing a three-dimensional circuit arrangement, two respective substrates 1a and 1b are arranged above one another (see FIG. 3). The upper substrate 1a has a depression 2a that extends up to a metallization level 3a whose side walls have an insulation 4a. The depression 2a has an auxiliary 5a that facilitates wetting and being filled with hardened amalgam 7a. The substrate has a surface provided with a polyimide layer 6a.

The lower substrate 1b has a surface provided with a polyimide layer 6b and has a depression 2b that extends up to the metallization level 3b. The depression 2b has an insulation 4b at its side walls. It also has an auxiliary layer 5b that covers the side walls and the floor that is electrically conductive and facilitates the wetting with amalgam. The lower substrate 1b has side facing away from the depression 2b connected to a carrier 9b via an adhesive layer 8b. The substrate 1b has been ground thin, for example, before the application of the carrier 9b and of the adhesive layer 8b to the surface facing away from the depression 2b.

The lower substrate 1b is arranged such that the carrier 9b is directed down, whereas the depression 2b is directed up. The depression 2b is filled with an amalgam 7b that has the same composition as the amalgam 7a. Tile amalgam 7b is produced with such low viscosity that it can be poured into the depression 2b. Care must thereby be exercised to see that no amalgam is situated at the surface of the polyimide layer 6b. Optionally, the amalgam 7b can be produced by deposition of a layer of the solid constituent at the walls of the depression and by filling the depression with the liquid constituent. The upper substrate 1a is arranged above the lower substrate 1b such that the depression 2a filled with amalgam 7a meets the depression 2b filled with amalgam 7b. Due to the surface tension of the liquid amalgam 7b, a fine adjustment of the two substrates 1a, 1b relative to one another thereby occurs.

Figure 4:
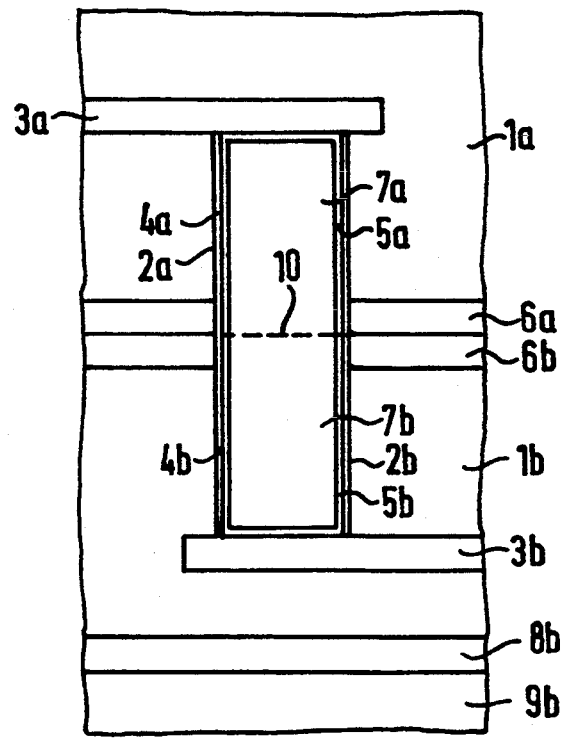
FIG. 4 shows a portion of a three-dimensional circuit arrangement of the invention wherein the lower and the upper substrates are connected via a hardened amalgam component.

The upper substrate 1a and the lower substrate 1b are joined such that the polyamide layers 6a and 6b touch one another (see FIG. 4). The amalgam 7a and the amalgam 7b thereby likewise come into contact. The amalgam 7a that has already hardened is thus slightly dissolved at the surface in the liquid amalgam 7b. As a result thereof, a connection arises between the amalgam 7a and the amalgam 7b. This connection is indicated by the broken line 10 in FIG. 4. The amalgam that is still liquid hardens, whereby a firm connection between the upper substrate 1a and the lower substrate 1b arises. The firm connection composed of the amalgam 7a and 7b simultaneously represents a contact between the metallization levels 3a and 3b.

By using an amalgam that greatly swells while hardening, a depression 2a in the upper substrate 1a can be expanded in the region of the polyimide layer 6a. This happens, for example, with a groove that annularly surrounds the cross section of the depression 2a in the region of the polyimide layer 6a and thus expands it in comparison to the cross section in the region of the upper substrate 1a. Cross sectional expansion of the depression 2a in the upper substrate 1a in the region wherein the polyimide layers 6a, 6b touch assures that the amalgam remains in the region of the firm connection when the liquid amalgam hardens. The amalgam is thereby prevented from spreading apart at the boundary surface between the two polyimide layers 6a, 6b, which could lead to a short. By heating the arrangement to 300° C., the polyimide layers 6a and 6b melt and form an additional mechanical connection.

When the upper and lower substrates 1a and 1b that are firmly joined to one another are to be applied onto a further substrate, it is advantageous to produce depressions in the side facing away from the upper substrate 1a after the thin-grinding and before the application of the carrier 9b on the lower substrate 1b. These depressions have an insulation, with an auxiliary layer and with hardened amalgam. After the joining of the upper substrate 1a and the lower substrate 1b, the carrier 9b and adhesive layer 8b can then be removed and the unit composed of upper and lower substrates 1a, 1b can be arranged on a further substrate as a whole according to the method set forth herein. Thus, a firm connection via amalgam contacts is produced.

Figure 5:
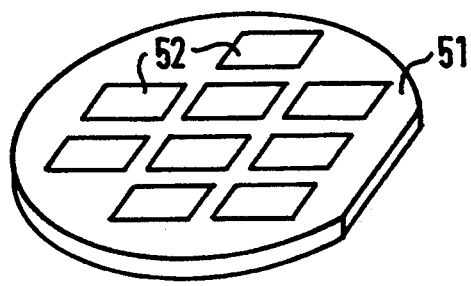
FIG. 5 shows a substrate wafer of the present invention that comprises a plurality of components.
Figure 6:
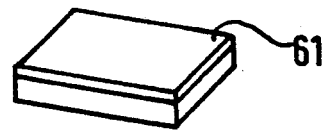
FIG. 6 shows a detached component of the invention.

In order to improve the yield in the manufacture of a three-dimensional circuit arrangement, it is advantageous to use a substrate wafer as the lower substrate which has a plurality of components, i.e. particularly microelectronic circuits or optoelectronic sensor components, as shown in FIG. 5. Detached components 61 are used as the upper substrate; such a component 61 is shown by way of example in FIG. 6.

Figure 7:
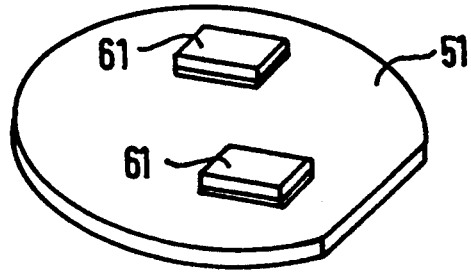
FIG. 7 shows a substrate wafer of the invention, at whose surface detached components are arranged and connected with amalgam.

Detached components 61 are arranged unit-by-unit on selected components 52 of the substrate wafer 51. The components 52 on which detached components 61 are arranged are selected, for example, according to their electrical characteristics. FIG. 7 shows the substrate wafer 51 having detached components 61 arranged thereon. The detached components 61 have depressions on their undersides with which they impinge the surface of the substrate wafer 51. These depressions are produced according to the method set forth with reference to FIGS. 1 and 2 and are filled with amalgam. The upper side of the substrate wafer 51 (corresponding to the lower substrate 1b in FIGS. 3 and 4) has depressions filled with liquid amalgam. By hardening the amalgam, the detached components 61 are firmly joined to the substrate wafer 51.

Figure 8:
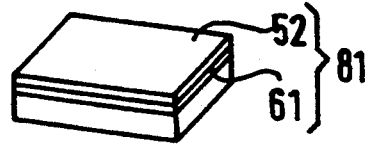
FIG. 8 shows a detached component stack of the invention.

The substrate wafer 51 is divided and detached component stacks 81, one of which is shown by way of example in FIG. 8, are produced. The detached component stacks 81 have a component 52 and a detached component 61 (see FIG. 6 and FIG. 5). The component 52 is firmly joined to the detached component 61 via at least one amalgam contact. Carrier and adhesive layer (corresponding to the example from FIGS. 3 and 4) are then removed from the surface of the component 52. The component stack 81 has two levels. For manufacturing a three-dimensional circuit structure having more than two levels, the component stack 81 is arranged on and joined to a further substrate wafer. The further substrate wafer is prepared in accord with the substrate wafer 51. The component stack 81 is arranged on the further substrate wafer so that the component 52 is directed down. In this way, the three-dimensional circuit structure is fabricated by multiply performing the method of the invention.

Since the depressions in this exemplary embodiment are respectively formed at the entire substrate wafer and the division only occurs afterwards, the method can be economically implemented.

Figure 9:
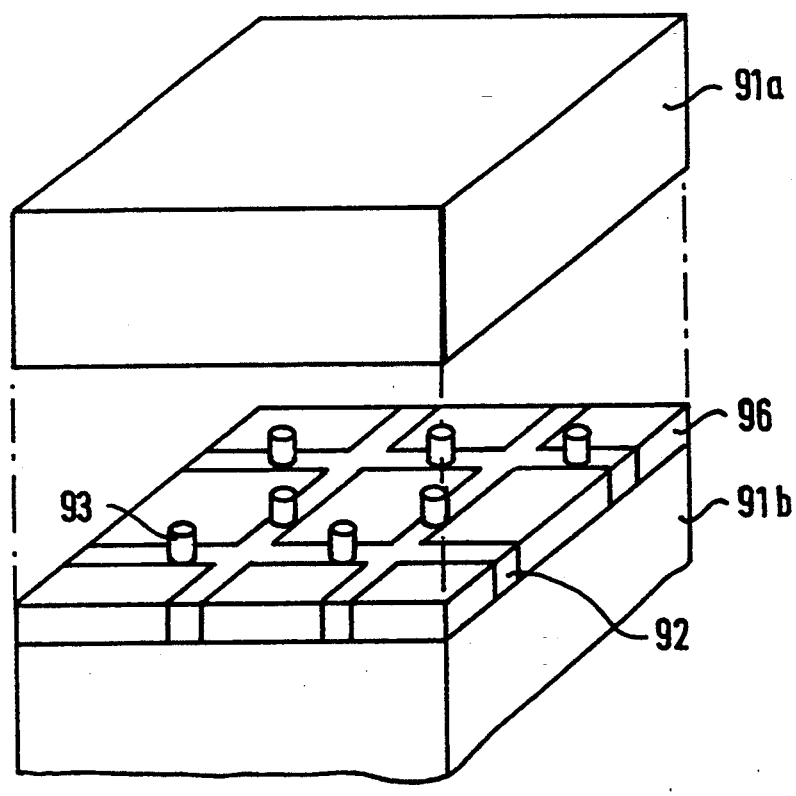
FIG. 9 shows an exploded view of two substrates of the invention that are connected to one another via depressions filled with amalgam and between which a polyimide layer having trenches filled with amalgam is arranged for lateral heat elimination.

For circuit arrangements wherein good heat elimination should be assured, metal tracks 92 filled with amalgam as shown in FIG. 9 are provided between an upper substrate 91a and a lower substrate 91b. To that end, trenches filled with amalgam are produced in a polyimide layer 96 that is arranged between the upper substrate 91a and the lower substrate 91b. Additional depressions that meet the trenches and are filled with amalgam can be produced in the underside of the upper substrate 91a and the upper side of the lower substrate 91b. As a result thereof, cooling fingers 93 that are in communication with the metal tracks 92 are produced after hardening of the amalgam (see FIG. 9).

Although I have described the invention by reference to particular illustrative embodiments thereof, many changes and modifications of the invention may become apparent to those skilled in the art without departing from the spirit and scope of the invention. I therefore intend to include within the patent warranted hereon all such changes and modifications as may be reasonably and properly included within the scope of my contribution to the art.

I claim:

1. A method for manufacturing a three-dimensional circuit apparatus, comprising the steps of:
    positioning a first upper substrate having circuit structures, a metallization level and an under side, above a second lower substrate having circuit structures, a metallization level and an upper side, as a stack;
    producing an upper depression, having side walls with an insulation, in said under side of said upper substrate directly above said upper side of said lower substrate, extending said upper depression into said upper substrate up to said metallization level;
    producing a lower depression, having side walls with an insulation, in said upper side of said lower substrate such that said lower substrate depression is aligned with said upper substrate depression, extending said lower depression into said lower substrate to said metallization level; and
    filling said depressions with a mixture of two metal constituents, providing one is a liquid constituent and the other is a solid constituent and said solid constituent dissolves in said liquid constituent, thereby causing a hardening of said mixture, further causing a firm connection between said substrates.

2. Method according to claim 1, comprising the additional steps of:
    producing a photoresist mask for producing the depressions; and
    forming said depressions by anisotropic etching.

3. Method according to claim 1, wherein said filling step is further defined by hardening said mixture at a temperature corresponding to the operating temperature of said circuit apparatus and having a melting temperature above said operating temperature.

4. Method according to claim 3, wherein said filling step is further defined by providing liquid Ga as said liquid constituent and Cu powder as said solid constituent.

5. Method according to claim 3, wherein said filling step is further defined by providing liquid Ga as said liquid constituent and Ni powder as said solid constituent.

6. Method according to claim 1, wherein said method is further defined by providing semiconductor substrates comprising microelectronic circuits as said substrates.

7. Method according to claim 1, wherein said method is further defined by providing semiconductor substrates comprising optoelectronic components as said substrates.

8. Method according to claim 1, wherein said producing steps are further defined by producing additional depressions at said upper side of said lower substrates and in said upper side of said upper substrate.

9. Method according to claim 1, further comprising the additional step of: forming said insulation by surface-wide deposition of a conformal $SiO_2$ layer and by anisotropic re-etching of said $SiO_2$ layer.

10. Method according to one claim 1, further comprising the additional step of: applying a polyimide layer surface-wide onto said upper side of said lower substrate and onto said under side of said upper substrate before producing said depressions.

11. Method according to claim 10, further comprising the additional step of: producing trenches filled with said mixture in at least one of said polyimide layers.

12. Method according to claim 10, further comprising the additional step of: enlarging the cross section of said depression in said under side of said upper substrate in the region of said polyimide layer.

13. Method according to claim 1, further comprising the additional step of: depositing an auxiliary layer at the flow of the depressions and on said insulation, said auxiliary layer promoting the wetting with said mixture.

14. Method according to claim 13, wherein said depositing step is further defined by forming said auxiliary layer of titanium.

15. Method according to claim 1, wherein said said filling step is further defined by filling said depressions with said mixture in a liquid state and shaking off excess liquid material.

16. Method according to claim 15, wherein said shaking off step is further defined by removing said excess liquid material by a tumbling motion.

17. Method according to claim 15, wherein said shaking off step is further defined by removing said excess liquid material by introducing said substrate into an alternating magnetic field.

18. Method according to claim 1, wherein said filling step is further defined by mixing a liquid constituent and a powdered constituent for forming said mixture, further providing powder particles of said powdered constituent with a porous layer selected from a group consisting of oxide, nitride and carbide.

19. Method according to claims 18, wherein said mixing step is further defined by doping said liquid constituent for enhancing the plasticity of said mixture.

20. Method according to claim 19, wherein said mixing step is further defined by providing gallium as said liquid constituent and boron as said dopant.

21. Method according to claim 19, wherein said mixing step is further defined by providing gallium as said liquid constituent and tungsten as said dopant.

22. Method according to claim 1, wherein said method is further defined by applying said solid constituent onto the surface of said depression as a layer and subsequently filling said depression with said liquid constituent, so that the dissolving of said solid constituent and, thus, the hardening of said mixture occurs only in said depression.

23. Method according to claim 22, wherein said method is further defined by providing gallium as said liquid constituent and selecting said solid constituent from a group consisting of antimony, chromium and silicon.

24. A method for manufacturing a three-dimensional circuit apparatus, comprising the steps of:
gluing a carrier onto the upper side of a substrate wafer having a plurality of components;
thin-grinding a surface of said substrate wafer that faces away from said carrier, said surface having a metallization level;
producing a depression having side walls with an insulation extending up to said metallization level in said surface;
arranging said substrate wafer such that said carrier is directed down;
filling said depression in said substrate wafer with a mixture of two metal constituents, wherein one is liquid and the other is solid and said solid constituent dissolves in said liquid constituent, thereby causing a hardening of said mixture; and
arranging a detached component, having a metallization level, as upper substrate on the upper side of said substrate wafer that is used as a lower substrate,
producing a depression having side walls with an insulation extending up to said metallization level in said detached component;
filling said depression in said detached component with hardened said mixture so that said depression in said detached component contacts said depression in said upper side of said substrate wafer;
hardening said mixture causing a firm connection between said component and said substrate wafer; and
removing said carrier after dividing said substrate wafer for detaching a component stack so that said component stack has a detached component and an allocated component from said substrate wafer.

25. Method according to claim 24, further comprising the steps of:
performing said producing step before gluing said carrier;
arranging said component stack, remaining after said division of said substrate wafer and said removing step, as an upper substrate on a second, correspondingly prepared substrate wafer as a lower substrate, whereby said depressions in said surface of said component stack filled with hardened said mixture align with and meet said depressions filled with unhardened said mixture at said upper side of said second substrate wafer; and
firmly joining said component stack to said second substrate wafer due to the hardening of said mixture and dividing said second substrate wafer for detaching component stacks now having an additional level.

26. Method according to claim 24, comprising the steps of:

producing a depression for each said component in the surface of said second substrate wafer, having a metallization level, which comprises the components before the division, extending said depression up to said metallization level;

performing said producing and filling steps on said detached components before their detachment with said hardened mixture; and detaching said components after the hardening of said mixture.

* * * * *